(12) United States Patent
Dietze et al.

(10) Patent No.: US 6,284,986 B1
(45) Date of Patent: Sep. 4, 2001

(54) METHOD OF DETERMINING THE THICKNESS OF A LAYER ON A SILICON SUBSTRATE

(75) Inventors: Gerald R. Dietze, Portland, OR (US); Oleg V. Kononchuk, Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/270,234

(22) Filed: Mar. 15, 1999

(51) Int. Cl.[7] ................................................. G01G 19/50
(52) U.S. Cl. .......................................... 177/50; 177/1; 73/1
(58) Field of Search ........................ 177/50, 1; 364/571; 73/1; 118/718, 726, 715, 727; 357/54, 52, 59, 73

(56) References Cited

U.S. PATENT DOCUMENTS

| | | |
|---|---|---|
| 4,203,799 | 5/1980 | Sugawara et al. . |
| 4,365,264 * | 12/1982 | Mukai et al. ........................... 357/54 |
| 4,401,052 * | 8/1983 | Baron et al. .......................... 118/718 |
| 4,525,854 * | 7/1985 | Molbert et al. ......................... 378/89 |
| 4,555,767 | 11/1985 | Case et al. . |
| 4,943,721 * | 7/1990 | Vidrine, Jr. ........................... 250/308 |
| 5,099,122 | 3/1992 | Miki . |
| 5,313,044 | 5/1994 | Massoud et al. . |
| 5,371,596 | 12/1994 | Hattori et al. . |
| 5,386,119 | 1/1995 | Ledger . |
| 5,564,830 | 10/1996 | Böbel et al. . |
| 5,625,170 * | 4/1997 | Poris ..................................... 177/50 |
| 5,681,448 | 10/1997 | Uchiyama et al. . |
| 5,704,985 | 1/1998 | Kordina et al. . |
| 5,723,378 | 3/1998 | Sato . |

OTHER PUBLICATIONS

"Silicon Processing for the VLSI Era," vol. 1: Process Technology, pp. 149–151, © 1986, Lattice Press, Sunset Beach, California.

* cited by examiner

Primary Examiner—Tuan H. Nguyen
Assistant Examiner—Laura Schillinger
(74) Attorney, Agent, or Firm—Alston & Bird LLP

(57) ABSTRACT

A method of determining the thickness of a layer on a substrate where the layer is deposited during a semiconductor manufacturing process. The substrate is weighed a first time. The layer is deposited on the substrate and the substrate is weighed a second time. The thickness of the layer is calculated using the difference between the second weighing and the first weighing.

7 Claims, 2 Drawing Sheets

METHOD OF DETERMINING THE THICKNESS OF A LAYER ON A SILICON SUBSTRATE

TECHNICAL FIELD

The present invention is directed to semiconductor manufacturing methods, and more particularly, to a method of determining the thickness of a layer deposited on a substrate. Still more particularly, the present invention is directed to a method of monitoring the thickness and uniformity of a layer deposited on a silicon substrate.

BACKGROUND OF THE INVENTION

In the process of manufacturing semiconductor wafers it is typically necessary to deposit layers of various materials onto a silicon wafer substrate to create desired electrical properties. Processes such as epitaxial deposition (EPI) or chemical vapor deposition (CVD) are commonly used to deposit materials onto substrates.

The properties of the layers deposited on the wafers often depend on the thickness and uniformity of the layers, and minute variations in layer thickness may dramatically alter the properties of the semiconductors manufactured therefrom. Semiconductor fabricators must therefore measure and control the thickness and uniformity of the layers with great accuracy. Many methods of measuring layer thickness have been devised using technologies such as ellipsometry, heat reflectivity, interferometry, and infrared reflectance. One commonly used measuring method is Fourier Transform Infrared Spectroscopy (FTIR). In this method, a silicon wafer acts as a shoulder of Michelson interforometer. The incident IR beam is split and one part of the radiation reflects from the wafer, while the other reflects from a moving mirror. These two parts of the radiation are then reflected to a detector where they produce an interference signal. Epitaxial layer thickness is calculated from the distance between interference maxima reflected from the substrate-layer interface and top silicon surface. This process may be repeated several times at different places on the wafer to ensure that the layer is uniformly deposited on the wafer.

In a semiconductor manufacturing process, it is typical to deposit a layer of material on a plurality or batch of silicon wafers at the same time. To conserve time, one wafer per batch may be tested using FTIR and the results of the test are assumed to apply to all the wafers in the batch. More regular testing, such as testing every fifth or tenth wafer, is also possible, but the more regular the testing, the slower the process becomes. Testing every wafer using FTIR may be too time-consuming for some manufacturing processes.

FTIR has other limitations. For example, the level of dopant concentration in the substrate must be three to four orders of magnitude greater than the level of dopant concentration of silicon in the deposited layer so that enough radiation can be reflected from the substrate-epitaxial layer interface. In addition, FTIR is effective when the thickness of the layer to be measured is no less than two microns. FTIR measurement of layer thickness and uniformity may not be practical for semiconductor designs that require either relatively equal levels of dopant concentration of silicon or the deposition of very thin layers. Furthermore, FTIR and the other technologies enumerated above require the purchase and maintenance of expensive and complex equipment.

SUMMARY OF THE INVENTION

The present invention provides a method of determining the thickness of a layer on a semiconductor substrate, the layer being deposited during a semiconductor manufacturing process. The substrate is weighed a first time before the layer has been deposited on it. The layer is then deposited on the substrate and the substrate, with the layer, is weighed a second time. The thickness of the layer is calculated using the difference between the second weighing and the first weighing. Specifically, the method includes determining the mass of the substrate prior to the deposition of the layer on the substrate; depositing the layer on the substrate; determining the combined mass of the substrate and the layer after the layer has been deposited on the substrate; determining the mass of the layer from the difference between the combined mass of the substrate and layer and the mass of the substrate; and calculating the thickness of the layer from the mass of the layer, the surface area of the substrate on which the layer is deposited, and the density of the layer.

The method of the present invention may be also be used to monitor thickness and uniformity of a layer deposited on a substrate during a semiconductor manufacturing process. This may be accomplished by: determining expected values for the thickness and uniformity of the layer deposited by a deposition process; correlating the expected values with an expected mass of the layer; defining a tolerance range about the expected mass of the layer, the tolerance range defining an acceptable variation from the expected mass; determining the mass of the substrate prior to the deposition of the layer; depositing the layer on the substrate using the deposition process; determining the combined mass of the substrate and layer after the layer has been deposited on the substrate; calculating the mass of the layer by subtracting the mass of the substrate from the combined mass of the substrate and layer; and further analyzing at least one of the thickness and the uniformity of the substrate if the calculated mass of the layer is outside the tolerance range.

DETAILED DESCRIPTION AND BEST MODE FOR CARRYING OUT THE INVENTION

The method of the present invention includes weighing a substrate before and after a layer is deposited on the substrate. The mass of the layer is determined by subtracting the mass of the substrate without the layer from the mass of the substrate with the layer. The thickness of the layer may then be determined using the mass of the layer, the density of the material comprising the layer, and the surface area of the substrate upon which the layer is deposited.

Figure 1:
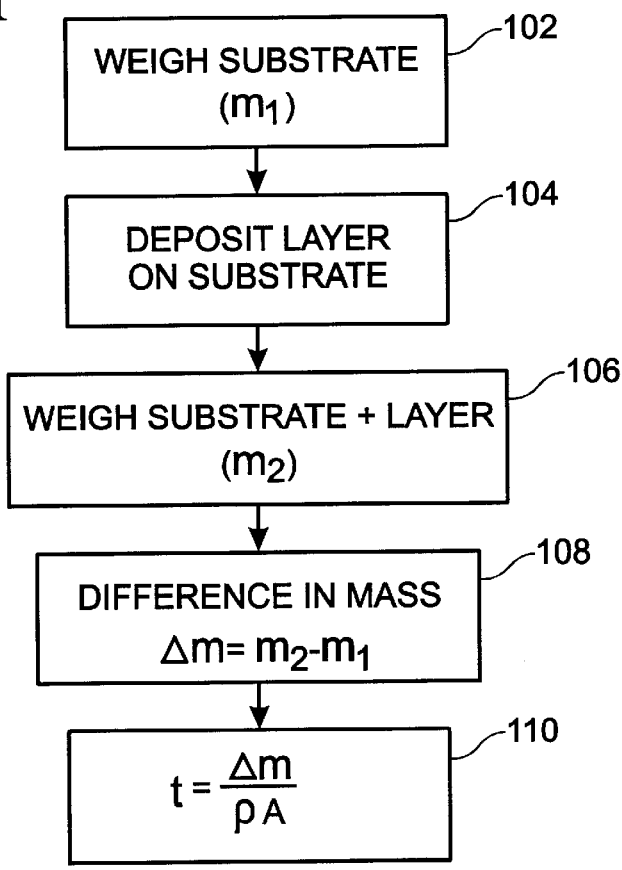
FIG. 1 is a flowchart showing the method of an embodiment of the invention.

An embodiment of the present invention may be described with reference to FIG. 1. In step, a substrate is weighed to determine the mass $m_1$ of the substrate. In step 104, a layer is deposited on an area A of the substrate. It is assumed that the layer is deposited substantially evenly and uniformly on area A. This may be accomplished by epitaxial deposition (EPI), chemical vapor deposition (CVD), or other known deposition methods. The layer is comprised of a material having a known and substantially uniform density $\rho$. In step 106, the substrate and layer are weighed to determine the combined mass $m_2$ of the substrate and the layer. In step 108, the mass $\Delta m$ of the layer is determined by subtracting the mass of the substrate $m_1$ from the combined mass of the substrate and layer $m_2$. In step 110, the thickness t of the layer is determined by dividing the mass of the layer $\Delta m$ by the density of the layer material $\rho$ and the area of the substrate A upon which the layer is deposited.

Figure 2:
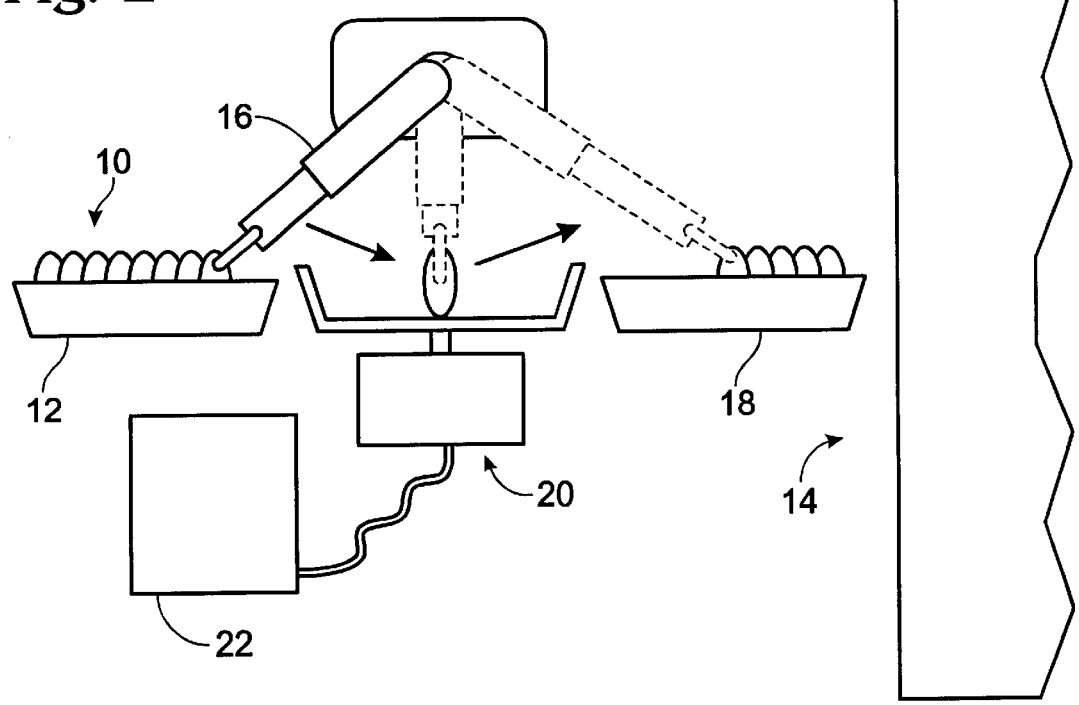
FIG. 2 is a schematic front elevational view of an apparatus used in the method outlined in FIG. 1.

The method of the present invention may be incorporated into an existing transfer process in which a plurality of substrates, shown in FIG. 2 as silicon wafers 10, are transported in a shipping tray or cassette 12 to the vicinity of an epideposition (EPI) reactor 14. Wafers 10 are then normally transferred one-by-one via a robotic arm 16 to a reactor tray or cassette 18 that is designed to be used in reactor 14. After wafers 10 are moved into reactor cassette 18, the reactor cassette is placed in EPI reactor 14 where a layer is deposited on a surface area of the wafers. Reactor cassette 18 is then removed from EPI reactor 14 and wafers 10 are transferred to shipping cassette 12 to be transported to another step in the manufacturing process.

The method of the present invention is incorporated into the above manufacturing process by providing a weighing device 20 convenient to the transfer process between shipping and reactor cassettes 12, 18. As shown schematically, robotic arm 16 may be programmed to transfer a wafer from shipping cassette 12 to weighing device 20 so that the mass $m_1$ of the wafer may be determined prior to depositing a layer on the wafer. Weighing device may be a commonly available analytical scale and should have a resolution of at least 0.1 milligrams. Robotic arm then transfers the wafer to reactor cassette 18. This process is repeated until each wafer in shipping cassette 12 is weighed and placed in reactor cassette 18. A computer 22 stores the mass $m_1$ of each wafer. After the layer is deposited on wafers in EPI reactor 14, robotic arm 16 transfers a wafer to weighing device 20 so that the combined mass $m_2$ of the wafer and the layer may be determined. The mass $\Delta m$ of the layer is determined by subtracting the mass of the wafer $m_1$ from the combined mass $m_2$ of the wafer and the layer. This is accomplished using computer 22. Robotic arm 16 transfers the wafer to shipping cassette 12. This process is repeated until each wafer with a deposited layer is weighed and transferred to shipping cassette 12. As previously described, the thickness t of the layer is determined by dividing the mass of the layer $\Delta m$ by the density of the layer material $\rho$ and the area of the substrate A upon which the layer is deposited. This may be done automatically by computer 22.

In certain semiconductor manufacturing processes, the substrate may be subject to strict requirements of size and material density, and it is therefore possible to predict the mass of the substrate prior to depositing the layer thereon using such predetermined characteristics. In such a case, the step of the present invention in which the mass of the substrate is determined prior to the deposition of the layer on the substrate may therefore be accomplished without weighing.

Figure 3:
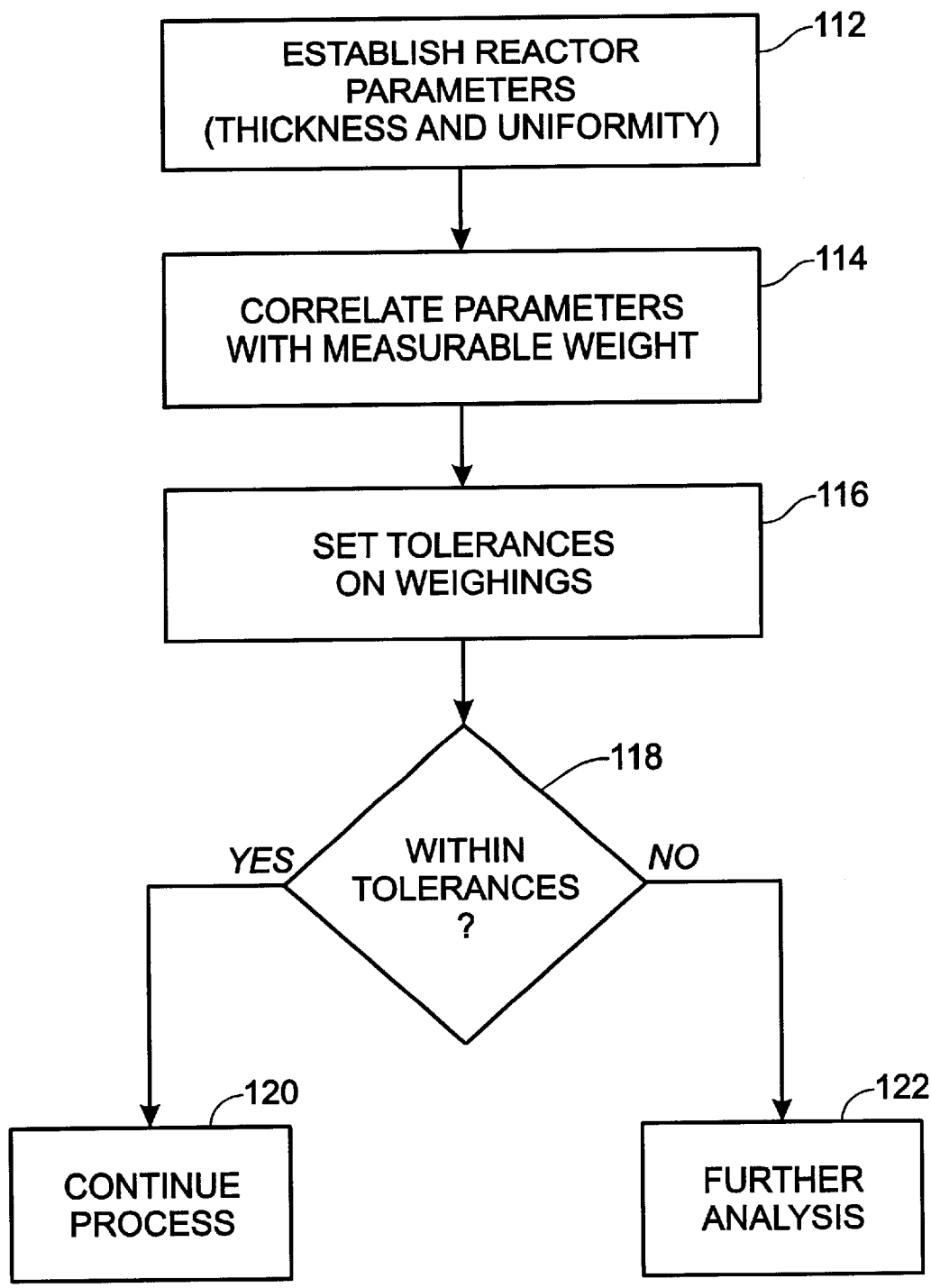
FIG. 3 is a flowchart showing the method of another embodiment of the invention.

Another embodiment of the invention permits the monitoring of the uniformity and thickness of a layer deposited on a substrate. The flowchart of FIG. 3 shows a series of steps in such a monitoring process. In step 112, the thickness and uniformity of a first or test layer is determined for a given deposition process. This may be done by depositing the test layer on a first or test substrate using the deposition process and measuring the thickness and uniformity of the test layer using FTIR or other known measuring methods. It is expected that layers of similar thickness and uniformity will be deposited on other substrates subjected to the same deposition process. In step 114, the mass of the test layer is determined using the method previously described. It is expected that a layer having a thickness and uniformity similar to the test layer will have a mass that is substantially the same as the mass of the test layer. It is also expected that there will be an acceptable range or variation in the mass of other layers deposited on the other substrates by the same deposition process. Therefore, in step 116, a range of tolerances of acceptable layer masses is established. This may be done by calculation or by weighing multiple test substrates and experimentally determining an acceptable mass variation for the test layers.

Once steps 112–116 have been performed, layers are deposited on other substrates and the masses of those layers are determined using the previously described method. If the mass of a second layer deposited on a second substrate is within the range of tolerances set in step 116, the thickness and uniformity of the second layer is determined to be acceptable, and the second substrate is permitted to continue in the semiconductor manufacturing process. This determination is shown in steps 118 and 120. However, if the mass of the second layer is not within the range of tolerances, it is presumed that the thickness and/or uniformity of the second layer are not acceptable. In step 122, the second layer is subjected to further analysis by FTIR or other known measurement methods to determine how the thickness and/or uniformity of the second layer varies from expected values. In this manner, the mass of a layer serves as an indicator or "flag" that checks the acceptability of the thickness and uniformity of the layer.

The invention may also be used to monitor at least one of thickness and uniformity of a layer deposited on a substrate by first determining an expected combined mass of the substrate and layer. This may be accomplished as described above or by weighing a substrate having a layer known to be of a desired thickness and uniformity. A tolerance range would then be defined about the expected combined mass of the substrate and layer, the tolerance range defining an acceptable variation from the expected combined mass. The actual combined mass of another substrate and layer would then be determined and at least one of the thickness and the uniformity of the layer on the other substrate would be analyzed if the actual combined mass of the substrate and layer is outside of the tolerance range. This variation of the invention further simplifies the steps needed to monitor the thickness or uniformity of a given layer.

One advantage of the present invention is that accurate thickness measurements may be made without large relative differences in dopant concentrations of silicon between the substrate and the layer. Another advantage is that layers having thicknesses of as little as ten nanometers (0.01 microns) may be analyzed and monitored using a weighing device with a resolution of 0.1 milligrams. Another advantage is that the method of the present invention may be incorporated into already existing wafer transfer processes. Yet another advantage is that the method uses weighing devices that are inexpensive compared to equipment used for other methods of determining layer thickness. Yet another advantage is that every wafer in a manufacturing process may be tested.

Industrial Applicability

This invention is applicable to the semiconductor manufacturing, and particularly to epideposition and chemical vapor deposition processes.

While the invention has been disclosed in its preferred form, the specific embodiments thereof as disclosed and illustrated herein are not to be considered in a limiting sense as numerous variations are possible. Applicant regards the subject matter of the invention to include all novel and non-obvious combinations and subcombinations of the various elements, features, functions and/or properties disclosed herein. No single feature, function, element or property of the disclosed embodiments is essential. The following claims define certain combinations and subcombinations which are regarded as novel and non-obvious. Other combinations and subcombinations of features, functions, elements and/or properties may be claimed through amendment of the present claims or presentation of new claims in this or a related application. Such claims are also regarded as included within the subject matter of applicant's invention irrespective of whether they are broader, narrower, or equal in scope to the original claims.

We claim:

1. In a semiconductor manufacturing process, a method of determining the thickness of a layer on a silicon substrate, the layer having a certain density and the layer being deposited on a certain surface area of the substrate, the method comprising:

transferring the substrate from a shipping tray to a weighing device;

determining the mass of the substrate by weighing the substrate by the weighing device;

transferring the substrate from the weighing device to a reactor tray;

depositing the layer on the substrate;

transferring the substrate from the reactor tray to the weighing device;

determining the combined mass of the substrate and layer by weighing the substrate by the weighing device;

determining the mass of the layer from the difference between the combined mass of the substrate and layer, and the mass of the substrate; and calculating the thickness of the layer from the mass of the layer, the surface area of the substrate, and the density of the layer.

2. The method of claim 1, wherein the calculating step uses the formula $$t = \frac{m_2 - m_1}{A\rho},$$

where t is the thickness of the layer, $m_2$ is the mass of the substrate and the layer, $m_1$ is the mass of the substrate, A is the area of the substrate upon which the layer is deposited, and $\rho$ is the density of the layer.

3. The method of claim 1, wherein the depositing step is performed at least partially by epitaxial deposition.

4. The method of claim 1, wherein the depositing step is performed at least partially by chemical vapor deposition.

5. The method of claim 1 wherein at least one of the limitations of transferring is accomplished by robotically moving the substrate.

6. In a semiconductor manufacturing process, a method of determining the thickness of a plurality of layers on a silicon substrate, each of the plurality of layers having a certain density and the layers being deposited on a certain surface area of the substrate, the method comprising:

(a) determining the mass of the substrate prior to the deposition of the plurality of the layers thereon;

(b) transferring the substrate from a shipping tray to a reactor tray;

(c) depositing a layer on the substrate;

(d) determining the combined mass of the substrate and layer by weighing the substrate by a weighing device;

(e) determining the mass of the layer from the difference between the combined mass of the substrate and layer, and the mass of the substrate;

(f) calculating the thickness of the layer from the mass of the layer, the surface area of the substrate upon which the layer is deposited, and the density of the layer, and (g) repeating steps, (c), (d), (e) and (f) for each of the plurality of layers, the mass of the substrate being defined as the combined mass of the substrate and any layers previously deposited thereon, and the surface area of the substrate being defined as the surface area over which the layer is deposited.

7. The method of claim 6, wherein the limitation of determining the combined mass of the substrate and layer is accomplished by robotically moving the substrate and layer to the weighing device.

* * * * *